United States Patent
Gunjishima et al.

(10) Patent No.: US 7,135,074 B2
(45) Date of Patent: Nov. 14, 2006

(54) METHOD FOR MANUFACTURING SILICON CARBIDE SINGLE CRYSTAL FROM DISLOCATION CONTROL SEED CRYSTAL

(75) Inventors: Itaru Gunjishima, Nagoya (JP); Daisuke Nakamura, Nagoya (JP); Naohiro Sugiyama, Nagoya (JP); Fusao Hirose, Obu (JP)

(73) Assignees: Kabushiki Kaisha Toyota Chuo Kenkyusho, Aichi-pref. (JP); Denso Corporation, Kariya (JP)

( * ) Notice: Subject to any disclaimer, the term of this patent is extended or adjusted under 35 U.S.C. 154(b) by 0 days.

(21) Appl. No.: 10/911,745

(22) Filed: Aug. 5, 2004

(65) Prior Publication Data
US 2005/0211156 A1    Sep. 29, 2005

(30) Foreign Application Priority Data
Apr. 8, 2004    (JP) .............................. 2004-114626

(51) Int. Cl.
*C30B 25/16*    (2006.01)
(52) U.S. Cl. .................... 117/101; 117/94; 117/902; 117/912
(58) Field of Classification Search ................ 117/94, 117/101, 902, 913, 88
See application file for complete search history.

(56) References Cited

U.S. PATENT DOCUMENTS 6,428,621 B1 *   8/2002   Vodakov et al. ............ 117/108
6,534,026 B1 *   3/2003   Vodakov et al. ............ 423/345
6,863,728 B1 *   3/2005   Vodakov et al. ............ 117/202

FOREIGN PATENT DOCUMENTS

| JP | A-H05-262599 | 10/1993 |
| JP | A-H08-59389 | 3/1996 |
| JP | A-8-143396 | 6/1996 |

OTHER PUBLICATIONS

Official Communication and its translation from Japanese Patent Office dated Oct. 4, 2005.

* cited by examiner

*Primary Examiner*—Felisa Hiteshew
(74) *Attorney, Agent, or Firm*—Posz Law Group, PLC

(57) ABSTRACT

A method for manufacturing a silicon carbide single crystal includes the steps of: preparing a seed crystal with a screw dislocation generation region; and growing the single crystal on a growth surface of the seed crystal. The generation region occupies equal to or smaller than 50% of the growth surface, which has an offset angle equal to or smaller than 60 degrees. The screw dislocation density in the single crystal generated from the generation region is higher than that in the other region. The single crystal includes a flat C-surface facet disposed on a growing surface of the single crystal. The C-surface facet overlaps at least one of parts of the growing surface provided by projecting the generation region in a direction perpendicular to the growth surface and in a direction parallel to a <0001> axis, respectively.

27 Claims, 12 Drawing Sheets

<0001>

US 7,135,074 B2

METHOD FOR MANUFACTURING SILICON CARBIDE SINGLE CRYSTAL FROM DISLOCATION CONTROL SEED CRYSTAL

CROSS REFERENCE TO RELATED APPLICATIONS

This application is based on Japanese Patent Applications No. 2003-106923 filed on Apr. 10, 2003, and No. 2004-114626 filed on Apr. 8, 2004, the disclosures of which are incorporated herein by reference.

FIELD OF THE INVENTION

The present invention relates to a method for manufacturing a silicon carbide single crystal from a dislocation control seed crystal.

BACKGROUND OF THE INVENTION

A semiconductor device formed from silicon carbide (i.e., SiC) single crystal is expected as a power device to replace a silicon device. To form a SiC power device having high performance, it is required to reduce leak current in the SiC substrate. The leak current in the SiC substrate is caused by a defect such as a screw dislocation in the SiC single crystal.

A conventional method for forming the SiC single crystal is a C-surface crystal growth method. In the C-surface crystal growth method, a SiC seed crystal has a growth surface, which is the C-surface or a surface having an offset angle in a range of 10 degrees (i.e., 10°) from the C-surface. The offset angle of the growth surface is determined from the C-surface. The growth surface of the SiC seed crystal exposes outside so that the SiC single crystal is grown on the growth surface by a sublimation recrystallization method or the like. However, when the C-surface is used for the growth surface of the seed crystal, and the SiC single crystal is grown along with a <0001> direction, many micro pipe defects or screw dislocations are generated along with the <0001> direction in the SiC single crystal.

To reduce the defect in the SiC single crystal, a method for manufacturing the SiC single crystal is disclosed in Japanese Patent Application Publication No. H5-262599. In this method, the seed crystal has the growth surface, which tilts by 60° to 120° from the C-surface. The SiC single crystal is grown along with an A-surface orientation direction so that the method provides an A-surface crystal growth method. In the SiC single crystal grown by the A-surface crystal growth method, a small amount of micro pipe defects and screw dislocations are generated. However, as shown in FIG. 17, the SiC single crystal 9 formed by the above method includes many stacking faults 95 parallel to the C-surface. The stacking faults 95 have high density in the SiC single crystal 9. Therefore, electric resistance of the SiC single crystal 9 perpendicular to the C-surface (i.e., parallel to a C-axis of a <0001> direction) becomes larger. Specifically, when electrons cross the stacking fault 95, the resistance becomes larger. Thus, the SiC single crystal 9 having high-density stacking fault 95 can not be used for the SiC power device.

To remove the stacking fault, in a process for manufacturing the SiC single crystal, it is required to use a seed crystal having a growth surface of the C-surface. Specifically, the A-surface grown seed crystal having no screw dislocation substantially is prepared firstly. Then, the A-surface grown seed crystal is cut so that the seed crystal having the growth surface of the C-surface is obtained. Here, the C-surface is exposed outside. Next, this seed crystal is used for the C-surface crystal growth so that the SiC single crystal having no screw dislocation nor stacking fault is obtained. However, in this method, as shown in FIG. 18, since the A-surface grown seed crystal 8 having the C-surface growth surface 81 has no screw dislocation substantially, there is no source for supplying steps when the C-surface crystal growth is performed using the A-surface grown seed crystal 8. The source supplies steps so that the A-surface grown seed crystal 8 is transcribed to a growing crystal 80. Specifically, the source supplies steps so that polymorphism of the A-surface grown seed crystal 8 is transferred to the growing crystal 80. However, there is no source so that the growing crystal 80 includes a heterogeneous polymorphous crystal 87 or a different surface orientation crystal 88, partially. If the heterogeneous polymorphous crystal 87 or the different surface orientation crystal 88 is grown, the SiC single crystal 80 includes many screw dislocation 89 at random. The SiC single crystal 80 having the different surface orientation crystal 88 or the screw dislocation 89 is not used for the device because of leak current.

In view of the above problem, another method for forming the SIC single crystal is disclosed in Japanese Patent Application Publication No. H8-59389. The method is such that the growth surface of the seed crystal includes an artificial convexity or concavity as a singular point. The singular point generates a screw dislocation as the source for supplying steps. Thus, the SiC single crystal is grown. However, the simple convexity or concavity has no screw component so that they may not work as the source for supplying steps for transferring the polymorphism of the A-surface grown seed crystal to the growing crystal. Specifically, when the SiC single crystal is grown by a certain amount, the convexity and concavity changes to the screw dislocation so that the convexity and concavity works as the source for supplying steps. However, in the beginning of the crystal growth, the heterogeneous polymorphous crystal 87 may be generated so that the heterogeneous polymorphous crystal 87 expands whole growing crystal 80. Then, the SiC single crystal may have inferior quality.

SUMMARY OF THE INVENTION

In view of the above-described problem, it is an object of the present invention to provide a method for manufacturing a silicon carbide single crystal having good quality with a small amount of screw dislocations, no heterogeneous polymorphous crystal and no different surface orientation crystal.

A method for manufacturing a silicon carbide single crystal includes the steps of: preparing a dislocation control seed crystal including a screw dislocation generation region for generating a screw dislocation in the silicon carbide single crystal; and growing the silicon carbide single crystal on a growth surface of the dislocation control seed crystal. The screw dislocation generation region occupies equal to or smaller than 50% of the growth surface of the dislocation control seed crystal. The growth surface has an offset angle equal to or smaller than 60 degrees measured from a {0001} surface of the silicon carbide single crystal. The screw dislocation in the silicon carbide single crystal generated from the screw dislocation generation region has a density higher than a density of the screw dislocation in the other region of the silicon carbide single crystal. In the step of growing the silicon carbide single crystal, the silicon carbide single crystal includes a flat C-surface facet disposed on a growing surface of the silicon carbide single crystal. The C-surface facet overlaps at least one of parts of the growing surface provided by projecting the screw dislocation generation region in a direction perpendicular to the growth surface and in a direction parallel to a <0001> axis of the silicon carbide single crystal.

The above method provides the silicon carbide single crystal having good quality with a small amount of screw dislocations, no heterogeneous polymorphous crystal and no different surface orientation crystal.

Preferably, the density of the screw dislocation generated from the screw dislocation generation region is equal to or higher than 100 dislocations per square centimeter.

Preferably, the dislocation control seed crystal further includes a low density screw dislocation region except for the screw dislocation generation region, and the low density screw dislocation region includes the screw dislocation, which is exposed outside and has a density smaller than 100 dislocations per square centimeter.

Preferably, the screw dislocation generation region includes the screw dislocation, which is exposed outside and has a density higher than a density of the screw dislocation in the low density screw dislocation region. More preferably, the density of the screw dislocation in the screw dislocation generation region is equal to or higher than 100 dislocations per square centimeter.

Preferably, the step of preparing the dislocation control seed crystal includes the steps of: preparing a first seed crystal including the screw dislocation generation region; growing the silicon carbide single crystal on the first seed crystal at least once in a direction perpendicular to a C-axis of the silicon carbide single crystal so that the silicon carbide single crystal provides the low density screw dislocation region; and slicing the silicon carbide single crystal for the dislocation control seed crystal in such a manner that the dislocation control seed crystal includes the screw dislocation generation region having the growth surface exposed outside. The screw dislocation on the growth surface of the screw dislocation generation region has the density higher than that of the other region of the dislocation control seed crystal.

Further, a method for manufacturing a silicon carbide single crystal includes the steps of: preparing a dislocation control seed crystal; and growing the silicon carbide single crystal on a growth surface of the dislocation control seed crystal. The dislocation control seed crystal includes a screw dislocation generation region for generating a screw dislocation in the silicon carbide single crystal and a low density screw dislocation region except for the screw dislocation generation region. The screw dislocation generation region occupies equal to or smaller than 50% of a growth surface of the dislocation control seed crystal. The growth surface has an offset angle equal to or smaller than 60 degrees measured from a {0001} surface of the silicon carbide single crystal. The low density screw dislocation region includes the screw dislocation having a surface density smaller than 100 dislocations per square centimeter. The screw dislocation generation region includes the screw dislocation having a surface density equal to or higher than 100 dislocations per square centimeter.

The above method provides the silicon carbide single crystal having good quality with a small amount of screw dislocations, no heterogeneous polymorphous crystal and no different surface orientation crystal.

Preferably, the step of preparing the dislocation control seed crystal includes the step of: preparing a first seed crystal including the growth surface with the offset angle equal to or smaller than 60 degrees measured from the {0001} surface of the silicon carbide single crystal; and processing a part of the growth surface of the first seed crystal so that a crystal structure of the first seed crystal is disturbed. The part of the growth surface occupies equal to or smaller than 50% of the growth surface of the first seed crystal. The part of the growth surface provides the screw dislocation generation region.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 16:
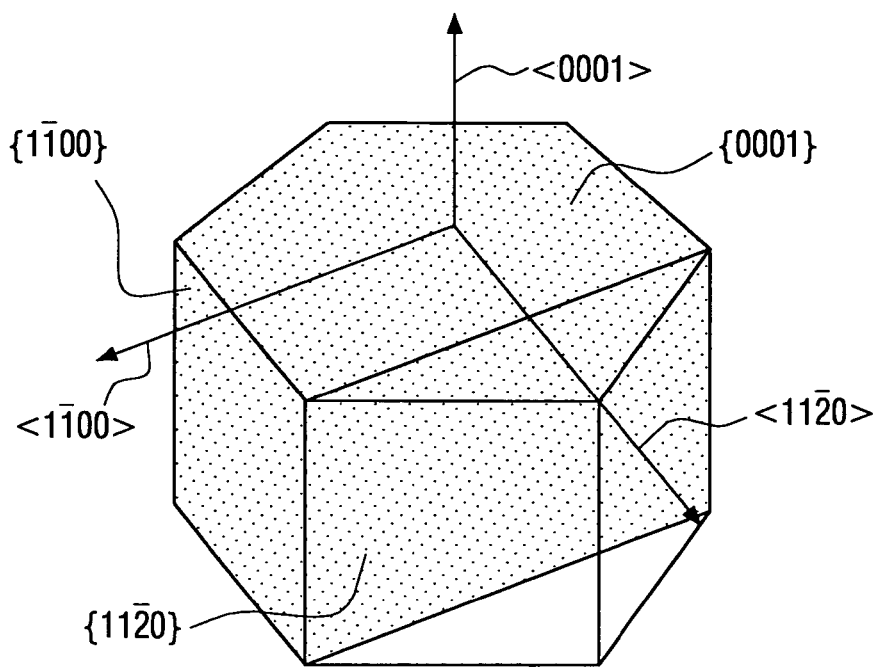
FIG. 16 is a perspective view explaining a surface orientation of the SiC single crystal, according to the first embodiment.
Figure 17:
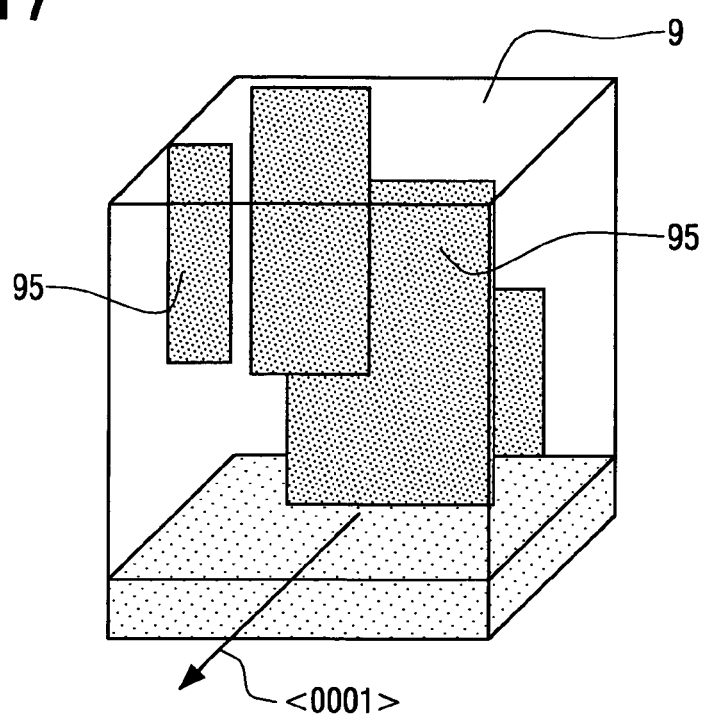
FIG. 17 is a perspective view showing a stacking fault in the SiC single crystal.
Figure 18:
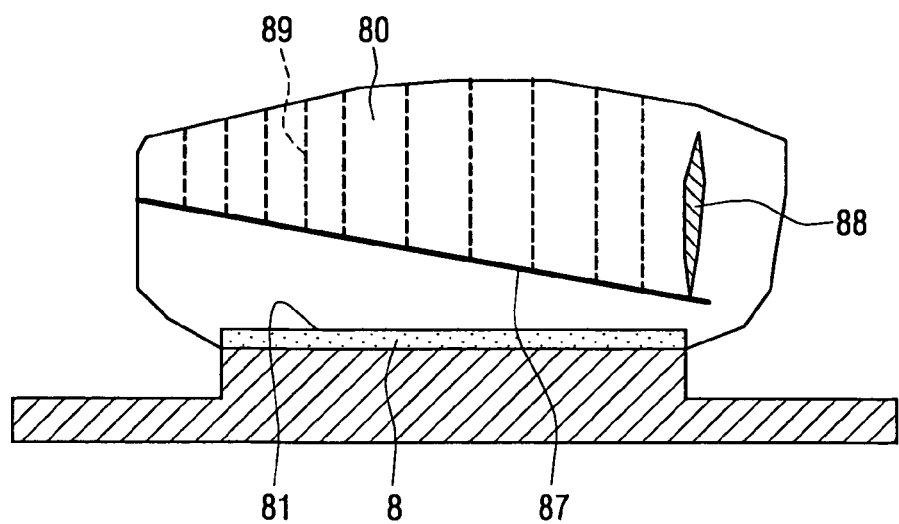
FIG. 18 is a cross sectional view showing a heterogeneous polymorphous crystal and a different surface orientation crystal in the SiC single crystal.

A SiC single crystal includes main surface orientations of a {0001} surface (i.e., a C-surface), a {1$\bar{1}$00} surface (i.e., an A-surface), and a {11$\bar{2}$0} surface (i.e., another A-surface), as shown in FIG. 16. The {1$\bar{1}$00} surface and the {11$\bar{2}$0} surface are perpendicular to the {0001} surface.

A method for forming the SiC single crystal according to a first embodiment of the present invention is shown in FIGS. 1 to 6. A bulk SiC single crystal 10 is grown on a growth surface 18 of a SiC seed crystal 1 so that the SiC single crystal 10 is obtained. The method includes a preparation process of the seed crystal 1 and a crystal growth process.

In the preparation process of the seed crystal 1, the growth surface 18 of the seed crystal 1 has an offset angle equal to or lower than 60 degrees (i.e., 60°) from a {0001} surface (i.e., a C-surface). Further, the seed crystal 1 includes a region 15 capable of generating screw dislocation (i.e., a screw dislocation generation region 15), which occupies equal to or smaller than 50% of the growth surface 18, so that the seed crystal 1 works as a dislocation control seed crystal 1. Specifically, the screw dislocation generation region 15 provides a screw dislocation 19 having high density, which is higher than that of the other region of the seed crystal 1. For example, the screw dislocation generation region 15 generates the screw dislocation 19 in the SiC single crystal 10 having a screw dislocation density equal to or higher than 100 dislocations per square centimeter (i.e., $100/cm^2$). The other region of the seed crystal 1 is a low density screw dislocation region 16. Thus, the growth surface 18 of the dislocation control seed crystal 1 includes the screw dislocation generation region 15 as a high density screw dislocation region and the low density screw dislocation region 16. The low density screw dislocation region 16 generates the screw dislocation 19 in the SiC single crystal 10 having a screw dislocation density lower than $100/cm^2$.

Figure 1:
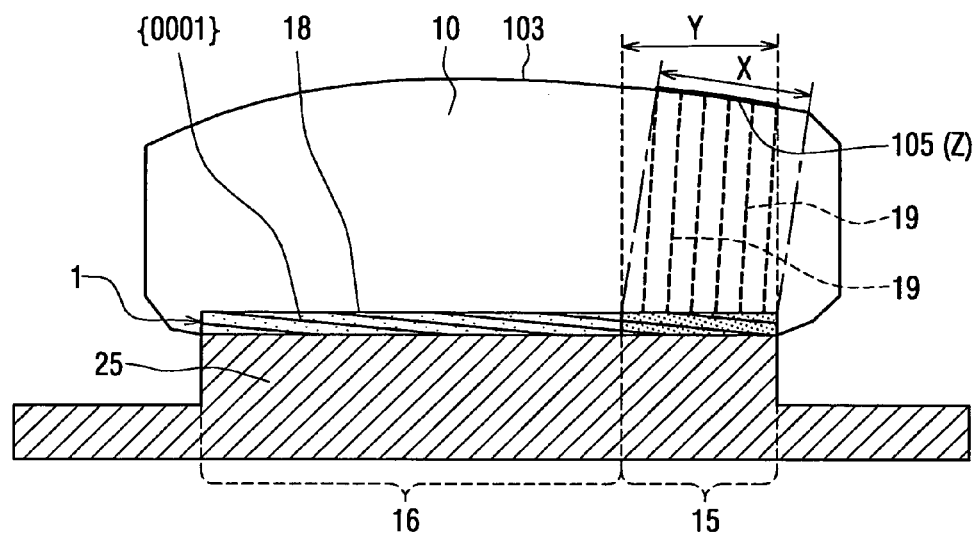
FIG. 1 is a cross sectional view explaining a method for manufacturing a silicon carbide single crystal on a dislocation control seed crystal, according to a first embodiment of the present invention.

In the crystal growth process, the SiC single crystal 10 is grown on the growth surface 18 of the dislocation control seed crystal 1, which is mounted on a base 25. As shown in FIG. 1, the SiC single crystal 10 grown on the growth surface 18 includes a C-surface facet 105 and a growing surface 103. The growing surface 103 is a surface, which is growing while the SiC single crystal is growing. The C-surface facet 105 having a flat surface is disposed on the growing surface 103. The C-surface facet 105 overlaps a part of the growing surface 103, which is provided by projecting the screw dislocation generation region 15 disposed on the growth surface 18 in a direction perpendicular to the growth surface 18, and further, the C-surface facet 105 overlaps another part of the growing surface 103, which is provided by projecting the screw dislocation generation region 15 disposed on the growth surface 18 in a direction of the C-axis (i.e., the <0001> direction). This is, the C-surface facet 105 overlaps at least one of the parts of the growing surface 103 provided by projecting the screw dislocation generation region 15 in the C-axis direction and the direction perpendicular to the growth surface 18. Specifically, in FIG. 1, the screw dislocation generation region 15 is projected on the growing surface 103 along with the C-axis so that a region shown as X in FIG. 1 is provided. The screw dislocation generation region 15 is projected on the growing surface 103 in the direction perpendicular to the growth surface 18 so that a region shown as Y in FIG. 1 is provided. An overlapping region between the C-surface facet and the regions X, Y is shown as Z.

Figure 3:
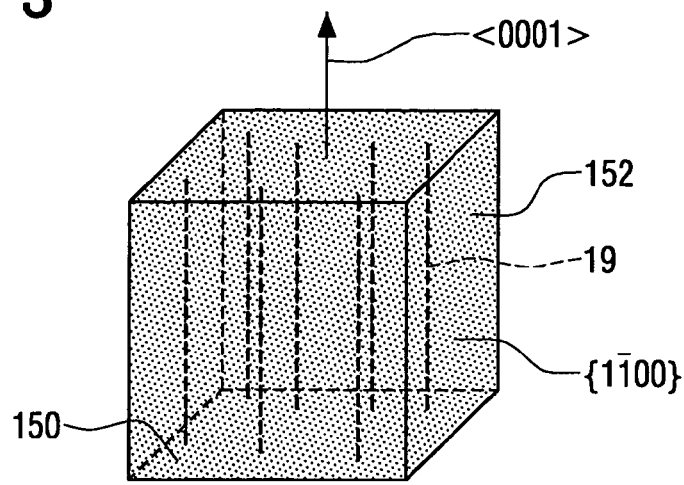
FIG. 3 is a perspective view showing the first seed crystal including a screw dislocation, according to the first embodiment.
Figure 4:
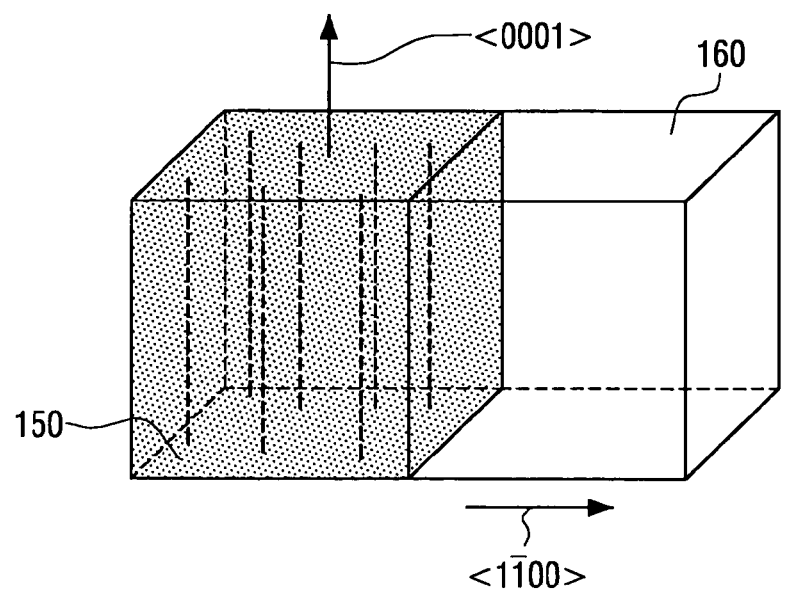
FIG. 4 is a perspective view explaining the first A-surface crystal growth performed on the first seed crystal, according to the first embodiment.
Figure 5:
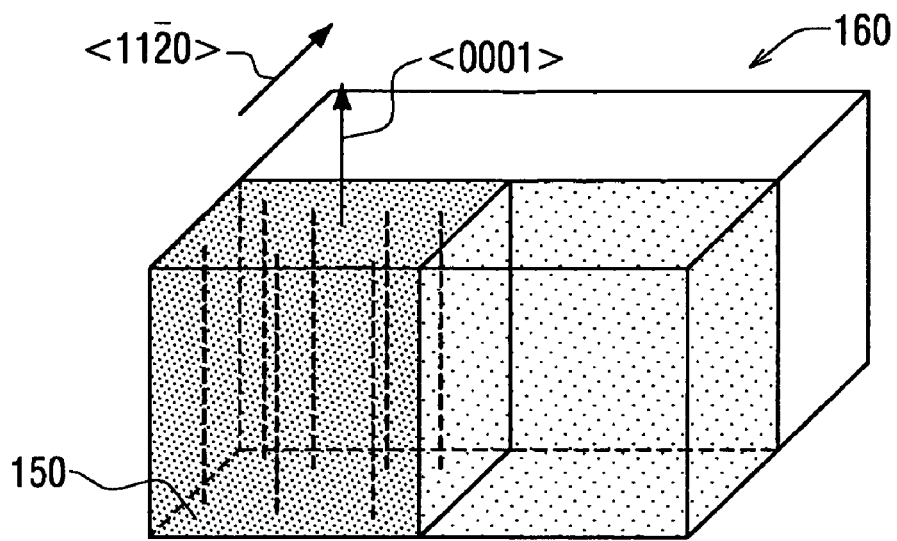
FIG. 5 is a perspective view explaining the second A-surface crystal growth performed on the first seed crystal, according to the first embodiment.

In the preparation process of the seed crystal 1, as shown in FIGS. 3 to 6, the first seed crystal 150 having a high density screw dislocation region is prepared. The first seed crystal 150 is made of SiC single crystal. The high density screw dislocation region has a screw dislocation density equal to or higher than $100/cm^2$, and is disposed at least a part of the first seed crystal 150. Next, as shown in FIGS. 4 and 5, the SiC single crystal is grown from the first seed crystal so that the second seed crystal 160 is formed. Here, the SiC single crystal is grown along with a direction perpendicular to the C-axis (i.e., the <0001> direction), as shown in FIG. 4. The SiC single crystal can be grown along with another direction perpendicular to the C-axis so that the second seed crystal 160 shown in FIG. 5 is prepared. This SiC single crystal grown from the first seed crystal 150 includes a low density screw dislocation, which is lower than $100/cm^2$. Thus, the second seed crystal 160 includes the high density screw dislocation region having the screw dislocation density equal to or higher than $100/cm^2$, and the low density screw dislocation region having the screw dislocation density lower than $100/cm^2$. Then, the dislocation control seed crystal 1 is sliced from the second seed crystal 160.

Specifically, The first seed crystal 150 has the growth surface 152, which is almost parallel to the <0001> direction. The growth surface 152 is exposed outside. The first seed crystal 150 is diced from a SiC single crystal having 4H polymorphism (i.e., a 4H SiC single crystal) so that the {1$\bar{1}$00} surface is exposed outside. The {1$\bar{1}$00} surface is parallel to the <0001> direction. The first seed crystal 150 includes the screw dislocation 19 with the screw dislocation density equal to or higher than $100/cm^2$.

Figure 2:
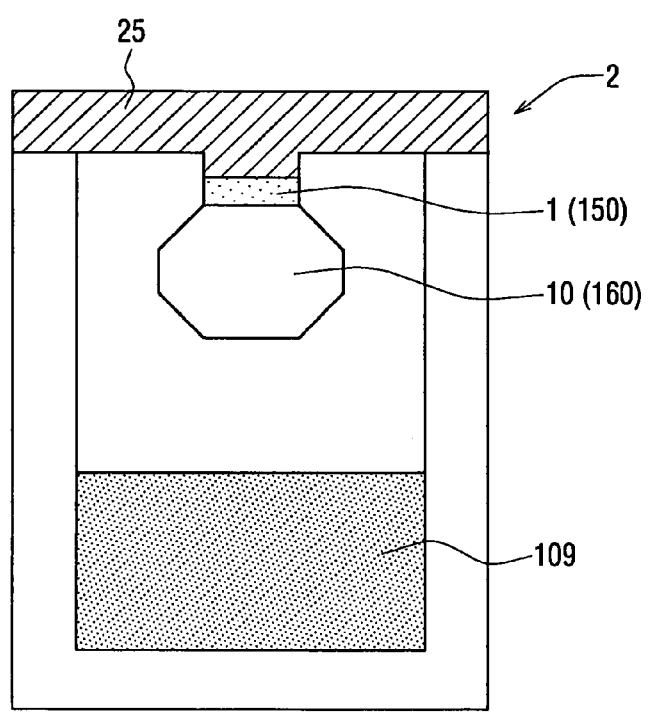
FIG. 2 is a cross sectional view showing a crucible for forming the SiC single crystal, according to the first embodiment.

Next, as shown in FIG. 2, the first seed crystal 150 and a SiC raw powder 109 are disposed inside a crucible 2 so that the first seed crystal 150 faces the SiC raw powder 109. The first seed crystal 150 is fixed on an inside of a base 25 of the crucible 2 with an adhesion or the like. The crucible is heated up to 2100° C. to 2300° C. under atmospheric pressure in a range between 1 Torr (i.e., $1.3 \times 10^2$ Pa) and 10 Torr (i.e., $1.3 \times 10^3$ Pa). At this time, temperature around the SiC raw powder 109 is set to be about 20° C. to 200° C. higher than the temperature around the seed crystal 150. The SiC raw powder 109 in the crucible 2 sublimes, so that the SiC single crystal is deposited on the first seed crystal 105. Thus, the second seed crystal 160 is prepared by a sublime recrystallization method.

Figure 6:
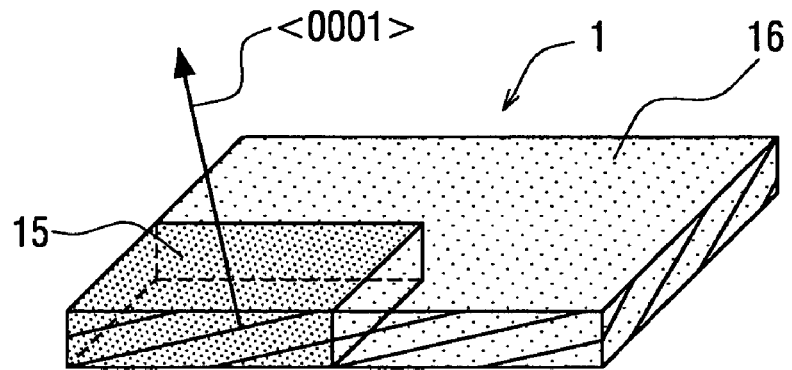
FIG. 6 is a perspective view showing the dislocation control seed crystal, according to the first embodiment.

As shown in FIG. 4, the SiC single crystal is grown on the first seed crystal 150 along with a <1$\bar{1}$00> direction. Further, the SiC single crystal is grown on the first seed crystal 150 along with a <11$\bar{2}$0> direction, as shown in FIG. 5. The second seed crystal 160 does not include the screw dislocation 19 except for the first seed crystal 150. Next, the dislocation control seed crystal 1 is sliced from the second seed crystal 160 so that a surface having a slant angle from the {0001} surface is exposed outside. Specifically, the top surface of the sliced dislocation control seed crystal 1 tilts from the {0001} surface by 8 degrees, as shown in FIG. 6. Thus, a part of the first seed crystal 150 remains so that the dislocation control seed crystal 1 includes the screw dislocation generation region 15 as a high density screw dislocation region, which is exposed outside, and has the screw dislocation density equal to or higher than 100/cm$^2$. A part of the second seed crystal 160 provides that the dislocation control seed crystal 1 includes the low density screw dislocation region 16, which is exposed outside, and has the screw dislocation density lower than 100/cm$^2$. In this case, the high density screw dislocation region 15 occupies about 25% of the growth surface 18 of the dislocation control seed crystal 1. Although the dislocation control seed crystal 1 has a quadratic prism shape, the dislocation control seed crystal 1 can have a column shape or a hexagonal prism shape.

Next, the SiC single crystal 10 is formed from the dislocation control seed crystal 1. In this crystal growth process, the SiC single crystal is grown in the crucible 2 by the sublime recrystallization method, as shown in FIG. 2. Specifically, the dislocation control seed crystal 1 and the SiC raw powder 109 are disposed in the crucible 2 so that the dislocation control seed crystal 1 faces the SiC raw powder 109. The dislocation control seed crystal 1 is fixed on the inside of the base 25 of the crucible 2 with an adhesion or the like. The crucible is heated up to 2100° C. to 2300° C. under atmospheric pressure in a range between 1 Torr (i.e., $1.3 \times 10^2$ Pa) and 10 Torr (i.e., $1.3 \times 10^3$ Pa). The SiC raw powder 109 in the crucible 2 sublimes, so that the SiC single crystal is deposited on the dislocation control seed crystal 1. Thus, the SiC single crystal 10 is formed.

The C-surface facet 105 is formed on the growing surface 103 of the SiC single crystal 10 while the SiC single crystal 10 is growing. The C-surface facet 105 is parallel to the {0001} surface. Since the growth surface 18 of the dislocation control seed crystal 1 tilts from the {0001} surface by 8 degrees, the C-surface facet 105 forming together with the SiC crystal growth is formed on a periphery of the growing surface 103. The screw dislocation 19 is introduced into the SiC single crystal 10 from the high density screw dislocation region 15 as the screw dislocation generation region 15 of the dislocation control seed crystal 1.

In the above method, the growth surface 18 of the dislocation control seed crystal 1 tilts from the {0001} surface by 8 degrees, and the screw dislocation generation region 15 of the dislocation control seed crystal 1 is formed on the periphery of the dislocation control seed crystal 1. Therefore, in the SiC single crystal 10, the C-surface facet 105 overlaps at least one of the parts of the growing surface 103 provided by projecting the screw dislocation generation region 15 in the C-axis direction and the direction perpendicular to the growth surface 18.

Therefore, while the SiC single crystal 10 is growing, the screw dislocation 19 or a penetration defect is always disposed inside the C-surface facet 105 so that the screw dislocation 19 works as the source for supplying steps, which provides the 4H SiC single crystal. Therefore, the SiC single crystal 10 does not have a heterogeneous polymorphous crystal or a different surface orientation crystal.

Further, the screw dislocation 19 is formed locally in the SiC single crystal 10 between the C-surface facet 105 and the screw dislocation generation region 15. Therefore, the screw dislocation 19 does not formed from the low density screw dislocation region 16. Thus, the SiC single crystal 10 grown from the low density screw dislocation region 16 has small amount of the screw dislocation 19 so that the SiC single crystal 10 has high quality of crystalline. Further, the SiC single crystal grown from the low density screw dislocation region 16 includes no heterogeneous polymorphous crystal and no different surface orientation crystal. Thus, the SiC single crystal 10 is suitably used for a SiC device. In the SiC single crystal 10, the screw dislocation 19 generated in the SiC single crystal 10 growing from the screw dislocation generation region 15 is disposed at the periphery of the SiC single crystal 10. Therefore, the periphery of the SiC single crystal 10 is removed so that the SiC single crystal 10 having no screw dislocation 19 is obtained. The SiC single crystal 10 without the high density screw dislocation is suitably used for the SiC device.

In the above method, the growth surface 18 of the dislocation control seed crystal 1 tilts from the {0001} surface by the offset angle equal to or lower than 60°. When the offset angle is larger than 60°, the C-surface facet may not be formed on the growing surface 103 of the SiC single crystal 10. Further, the stacking fault may be generated in the SiC single crystal 10.

Further, it is preferred that the offset angle of the growth surface 18 of the dislocation control seed crystal 1 is in a range between 1° and 15°. When the offset angle is lower than 1°, it is difficult to overlap the C-surface facet 105 and at least one of the parts of the growing surface 103 provided by projecting the screw dislocation generation region 15 in the C-axis direction and the direction perpendicular to the growth surface 18. On the other hand, when the offset angle is higher than 15°, it is required for the SiC single crystal 10 to grow larger (i.e., higher from the growth surface 18) so that the stacking fault is removed.

Furthermore, the growth surface 18 of the dislocation control seed crystal 1 can be the {0001} surface. In this case, the C-surface facet 105 may be formed at undetermined position. Therefore, to overlap the C-surface facet 105 and at least one of the parts of the growing surface 103 provided by projecting the screw dislocation generation region 15 in the C-axis direction and the direction perpendicular to the growth surface 18, it may be required to control a concentration distribution of the reactive gas or to control a temperature distribution in the crucible 2, i.e., the growth surface 18 of the dislocation control seed crystal 1 in the crucible 2.

Although the SiC single crystal 10 is formed by the sublimation recrystallization method, the SiC single crystal can be formed by a chemical vapor deposition method, a liquid phase crystal growth method or the like. Preferably, the SiC single crystal 10 is formed by the sublimation recrystallization method. In this case, the SiC single crystal 10 is grown to have a sufficient height from the dislocation control seed crystal 1. Therefore, the SiC single crystal 10 having a large diameter is obtained.

Here, the screw dislocation generated from the screw dislocation generation region 15 has a dislocation density higher than that generated from the other region around the screw dislocation generation region 15. If the screw dislocation density of the screw dislocation 19 generated from the screw dislocation generation region 15 is lower than that generated from the other region around the screw dislocation generation region 15, the heterogeneous polymorphous crystal or the different surface orientation crystal may be formed in the SiC single crystal. The screw dislocation 19 includes a micro pipe defect. The micro pipe defect can be defined as the screw dislocation having a large Burgers Vector. Thus, the screw dislocation generation region 15 includes the micro pipe defect.

Preferably, the screw dislocation generation region 15 is capable of generating the screw dislocation having the screw dislocation density one hundred times equal to or higher than the other region (i.e., the low density screw dislocation region 16). When the screw dislocation density of the screw dislocation 19 generated from the screw dislocation generation region 15 is one hundred times lower than the other region, the polymorphism of the dislocation control seed crystal 1 is not transferred sufficiently to the growing crystal, so that the heterogeneous polymorphous crystal or the different surface orientation crystal may be formed in the SiC single crystal 10. Further, the screw dislocation 19 generated from the other region of the dislocation control seed crystal 1 increases so that the quality of the SiC single crystal 10 grown from the other region becomes worse. Thus, the screw dislocation density of the screw dislocation generated from the screw dislocation generation region 15 is one hundred times equal to or higher than the other region. More preferably, the screw dislocation density of the screw dislocation generated from the screw dislocation generation region 15 is one thousand times equal to or higher than the other region. Furthermore, preferably, the screw dislocation density of the screw dislocation generated from the screw dislocation generation region 15 is ten thousand times equal to or higher than the other region.

Preferably, the screw dislocation generation region 15 is capable of generating the screw dislocation having the screw dislocation density equal to or larger than $100/cm^2$. When the screw dislocation density of the screw dislocation 19 generated from the screw dislocation generation region 15 is smaller than $100/cm^2$, the polymorphism of the dislocation control seed crystal 1 is not transferred sufficiently to the growing crystal, so that the heterogeneous polymorphous crystal or the different surface orientation crystal may be formed in the SiC single crystal 10. More preferably, the screw dislocation generation region 15 is capable of generating the screw dislocation having the screw dislocation density equal to or larger than $1000/cm^2$. Furthermore, preferably, the screw dislocation generation region 15 is capable of generating the screw dislocation having the screw dislocation density equal to or larger than $10000/cm^2$.

In the above method, the screw dislocation generation region 15 occupies equal to or smaller than 50% of the growth surface 18 of the seed crystal 1. If the screw dislocation generation region 15 occupies larger than 50% of the growth surface 18, many screw dislocations are formed in the SiC single crystal 10. Preferably, the screw dislocation generation region 15 occupies equal to or smaller than 30% of the growth surface 18 of the seed crystal 1. More preferably, the screw dislocation generation region 15 occupies equal to or smaller than 10% of the growth surface 18 of the seed crystal 1.

In the above method, the screw dislocation generation region 15 is disposed on one end of the seed crystal 1. In this case, the screw dislocation 19 generated in the Sic single crystal 10 growing from the screw dislocation generation region 15 is disposed at the periphery of the SiC single crystal 10. In this case, the periphery of the SiC single crystal 10 is removed so that the SiC single crystal 10 having no screw dislocation 19 is obtained. Further, the SiC single crystal 10 without removing the periphery of the SiC single crystal 10, which includes the high density screw dislocation 19, may be used for the SiC device.

In the above method, the other region (i.e., the low density screw dislocation region 16) of the screw dislocation generation region 15 has the growing surface 18, which includes the screw dislocation density lower than $100/cm^2$. In this case, the screw dislocation 19 generated in the SiC single crystal 10 transferred from the low density screw dislocation region 16 is much reduced. Therefore, the SiC single crystal 10 grown from the low density screw dislocation region 16 becomes high quality. If the screw dislocation density in the low density screw dislocation region 16 is larger than $100/cm^2$, the screw dislocation 19 may be formed in the SiC single crystal 10 grown from the low density screw dislocation region 16 of the seed crystal 1. Preferably, the screw dislocation density in the low density screw dislocation region 16 is smaller than $10/cm^2$. More preferably, the screw dislocation density in the low density screw dislocation region 16 is smaller than $1/cm^2$. Furthermore, preferably, the screw dislocation density in the low density screw dislocation region 16 is equal to $0/cm^2$ substantially.

In the above method, the screw dislocation generation region 15 has the growth surface 18, which includes the screw dislocation density higher than that of the low density screw dislocation region 16. In this case, the screw dislocation 19 in the screw dislocation generation region 15 as the high density screw dislocation region is transferred to the SiC single crystal grown from the screw dislocation generation region 15 of the seed crystal 1. Therefore, the screw dislocation 19 is easily and partially introduced into the SiC single crystal 10 while the single crystal is growing.

Preferably, the screw dislocation density of the screw dislocation exposed on the growth surface 18 of the screw dislocation generation region 15 is equal to or larger than $100/cm^2$. In this case, the screw dislocation 19 transferred from the screw dislocation 19 of the screw dislocation generation region 15 into the SiC single crystal 10 grown from the screw dislocation generation region 15 is equal to or larger than $100/cm^2$. If the screw dislocation density of the screw dislocation generation region 15 is smaller than $100/cm^2$, the screw dislocation 19 transferred from the screw dislocation generation region 15 into the SiC single crystal 10 is smaller than $100/cm^2$. Therefore, the polymorphism of the dislocation control seed crystal 1 may not be transferred to the growing crystal 80 sufficiently. Thus, the SiC single crystal 10 may have the heterogeneous polymorphous crystal or the different surface orientation crystal. Preferably, the screw dislocation generation region 15 includes at least one part of the region 15 having the screw dislocation density of the screw dislocation generation region 15 equal to or larger than $1000/cm^2$. In this case, the heterogeneous polymorphous crystal or the different surface orientation crystal is prevented from generating in the SiC single crystal 10.

In the above method, the seed crystal 1 including the screw dislocation generation region 15 is easily obtained. At least part of the first seed crystal 150 includes the screw dislocation 19. The second seed crystal 160 is grown from the first seed crystal 150 in the direction perpendicular to the C-axis more than once, i.e., the second seed crystal 160 is grown in the <1100> direction and in the <11$\bar{2}$0> direction, respectively. The dislocation control seed crystal 1 includes the high density screw dislocation region 15 and the low density screw dislocation region 16 having the screw dislocation density lower than that of the high density screw dislocation region 15. This is because the screw dislocation is not transferred in the direction perpendicular to the C-axis substantially. Here, the crystal growth in the direction perpendicular to the C-axis is performed by using the seed crystal having the growth surface 18 perpendicular to the C-surface. This crystal growth in the direction perpendicular to the C-axis can be performed once or more repeatedly. Specifically, as shown in FIG. 4, the second seed crystal 160 is grown from the first seed crystal 150 in the <1$\bar{1}$00> direction, which is perpendicular to the C-axis. Then, the second seed crystal 160 is grown from the first seed crystal 150 again in the <11$\bar{2}$0> direction, which is also perpendicular to the C-axis. Thus, the A-surface crystal growth is performed repeatedly in the direction perpendicular to the C-axis, so that the screw dislocation generated in the second seed crystal 160 except for the first seed crystal region is much reduced.

Second Embodiment

A method for manufacturing the SiC single crystal according to a second embodiment of the present invention is described as follows. In the preparation process, the third seed crystal 5 having no screw dislocation substantially is prepared. A part of the growth surface 18 of the third seed crystal 5 is processed by a surface treatment so that the screw dislocation generation region 15 is formed. Thus, the dislocation control seed crystal 1 is prepared. The method is described in detail as follows.

Figure 7:
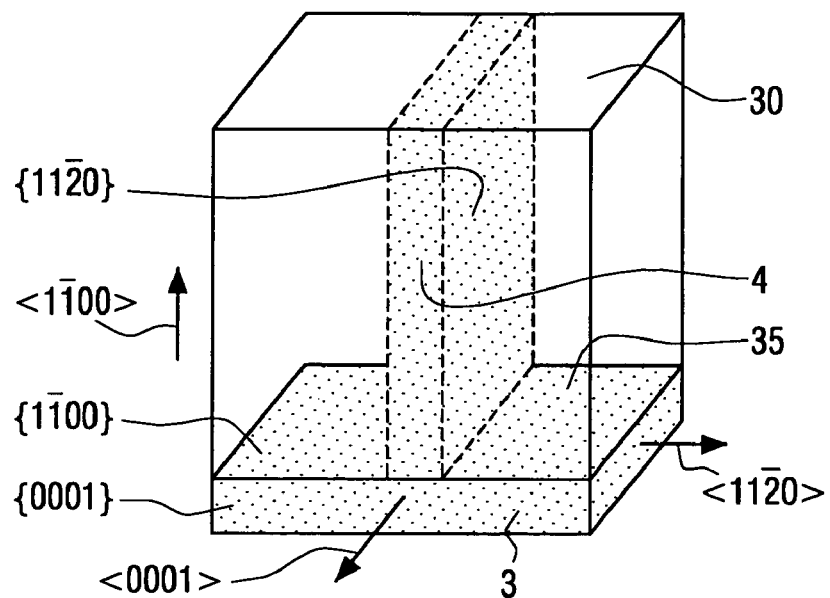
FIG. 7 is a perspective view explaining the first A-surface crystal growth, according to a second embodiment of the present invention.

Firstly, the third seed crystal 5 having no screw dislocation 19 is formed as follows. As shown in FIG. 7, the first seed crystal 3 has the {1$\bar{1}$00} surface as a growth surface 35 exposed outside. A SiC single crystal 30 is grown on the growth surface 35 of the first seed crystal 3. Next, the second seed crystal 4 is sliced from the SiC single crystal 30. The second seed crystal 4 has the {11$\bar{2}$0} surface exposed outside.

Then, another SiC single crystal 40 is formed on a growth surface 45 of the second seed crystal 4, which is the {11$\bar{2}$0} surface. Next, the seed crystal 5 is sliced from the SiC single crystal 40. The seed crystal 5 has a growth surface 55 exposed outside. The growth surface 55 of the seed crystal 5 tilts from the {0001} surface by 8 degrees. Thus, the SiC single crystal 40 is formed on the second seed crystal 4 along with the <11$\bar{2}$0> direction, i.e., an A-axis, so that the SiC single crystal 40 is formed by the A-surface crystal growth method. Thus, the seed crystal 5 is formed from the A-surface growth crystal, i.e., the SiC single crystal 40 so that the seed crystal 5 does not include the screw dislocation substantially.

Figure 9:
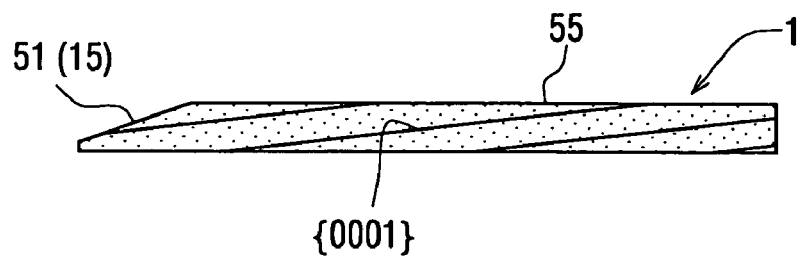
FIG. 9 is a side view showing the dislocation control seed crystal, according to the second embodiment.
Figure 10:
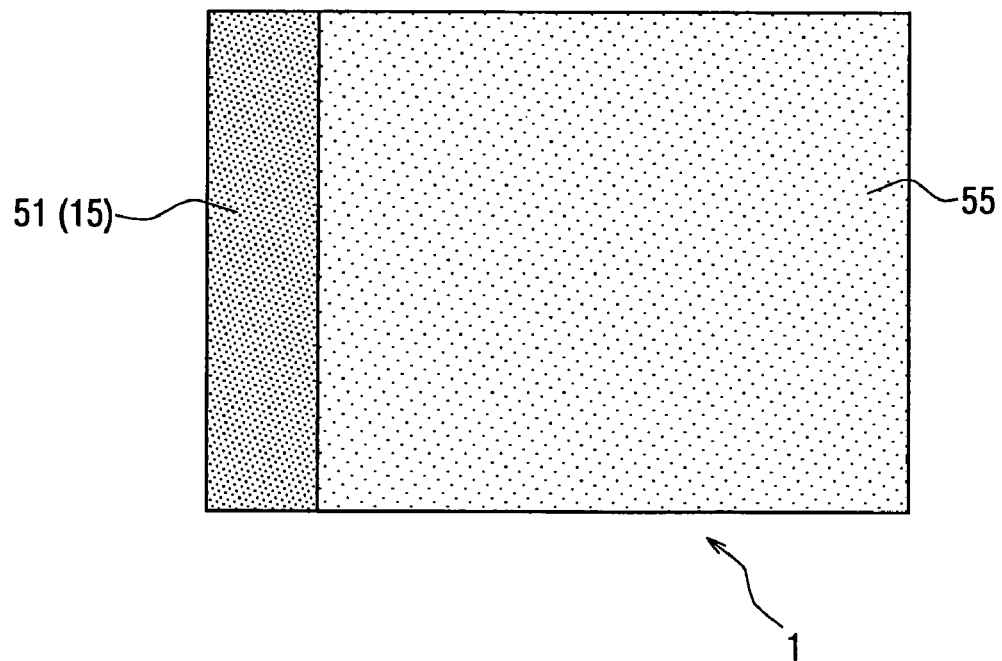
FIG. 10 is a top view showing the dislocation control seed crystal seeing from a growth surface, according to the second embodiment.

Next, the surface of the seed crystal 5 is treated. Specifically, as shown in FIGS. 9 and 10, the one end of the seed crystal 5 is grinded by machining so that a machined surface (i.e., a grinded surface) 51 is formed. The grinded surface 51 corresponds to the screw dislocation generation region 15 shown in FIG. 1.

The grinded surface 51 tilts from a growth surface 55 of the third seed crystal 5 by 10 degrees to 20 degrees. Thus, the dislocation control seed crystal 1 is completed. The grinded surface 51 of the dislocation control seed crystal 1 has a distorted crystal structure of SiC. Therefore, when the SiC single crystal 10 is grown by using the dislocation control seed crystal 1 having the grinded surface 51, the screw dislocation having the screw dislocation density equal to or larger than 100/cm$^2$ is generated from the grinded surface 51. This is, the grinded surface 51 corresponds to the screw dislocation generation region 15 shown in FIG. 1.

Figure 11:
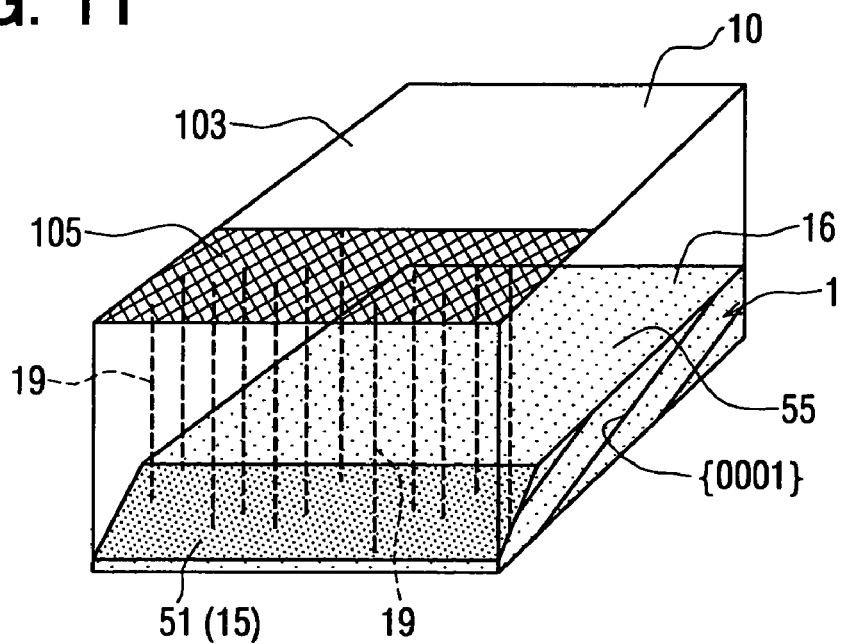
FIG. 11 is a perspective view explaining a method for manufacturing a silicon carbide single crystal on the dislocation control seed crystal, according to the second embodiment.

The SiC single crystal 10 is grown by using the dislocation control seed crystal 1 having the grinded surface 51 as follows. The SiC single crystal 10 is grown by the sublimation recrystallization method. As shown in FIG. 11, the screw dislocation 19 having the screw dislocation density equal to or larger than 100/cm$^2$ is generated from the grinded surface 51 as the screw dislocation generation region 15. Therefore, a part of the SiC single crystal grown from the grinded surface 51 becomes the high density screw dislocation region.

Here, since the dislocation control seed crystal 1 is formed from the SiC single crystal grown by the A-surface crystal growth method, no screw dislocation is generated from the dislocation control seed crystal 1 except for the grinded surface 51. Thus, another part of the SiC single crystal 10 grown from the growth surface 55 except for the grinded surface 51 becomes the low density screw dislocation region. The growth surface 55 except for the grinded surface 51 corresponds to the low density screw dislocation region 16 shown in FIG. 1.

In this embodiment, the dislocation control seed crystal 1 includes the growth surface 55 having the offset angle of 8 degrees tilted from the {0001} surface and the grinded surface 51 having the offset angle (i.e., the tilt angle) from the growth surface 55, which is larger than the offset angle of 8 degrees. Therefore, the C-surface facet 105 formed on the growing surface 103 is formed between the grinded surface 51 and the growth surface 55 while the SiC single crystal 10 is growing. At this time, the screw dislocation (or the penetration defect) 19 is generated from the grinded surface 51 in the C-surface facet 105. The C-surface facet 105 is disposed in a range over the grinded surface 51 as the screw dislocation generation region 15 and disposed at a periphery of the growing surface 103 while the SiC single crystal 10 is growing. Therefore, the C-surface facet 105 formed on the growing surface 103 overlaps at least one of the parts of the growing surface 103 provided by projecting the screw dislocation generation region 15 in the C-axis direction and the direction perpendicular to the growth surface 18.

Therefore, while the SiC single crystal 10 is growing, the screw dislocation 19 or the penetration defect is always disposed inside the C-surface facet 105 so that the screw dislocation 19 works as the source for supplying steps, which provides the 4H SiC single crystal. Therefore, the SiC single crystal 10 grown from the low density screw dislocation region 16 of the dislocation control seed crystal 1 does not have the heterogeneous polymorphous crystal or the different surface orientation crystal. Further, the SiC single crystal 10 except for the C-surface facet 105 has a small amount of the screw dislocation 19.

Figure 19:
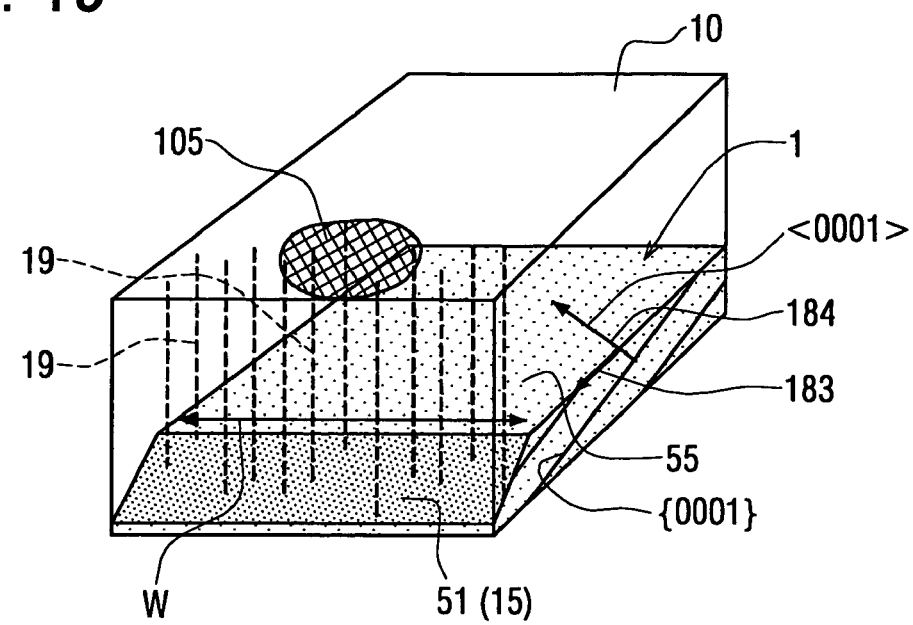
FIG. 19 is a perspective view explaining a method for manufacturing a silicon carbide single crystal on a dislocation control seed crystal, according to the second embodiment.

In the above method, specifically, in the crystal growth process, preferably, the SiC single crystal 10 is formed such that the C-surface facet 105 is disposed at almost the center of the growing surface 103 in a direction, which is perpendicular to both of the <0001> direction of the dislocation control seed crystal 1 and an offset direction 183, as shown in FIG. 19. Specifically, the C-surface facet 105 is disposed at the center of the growing surface 103 in a direction W, which is perpendicular to both of the <0001> direction and the offset direction 183. In this case, the C-surface facet 105 formed on the growing surface 103 becomes smaller. Thus, the area of the C-surface facet 105 is small. However, when the C-surface facet 105 becomes larger, the heterogeneous polymorphous crystal or the different surface orientation crystal is easily formed in the SiC single crystal 10. Thus, the above method provides to reduce the heterogeneous polymorphous crystal or the different surface orientation crystal.

Figure 20:
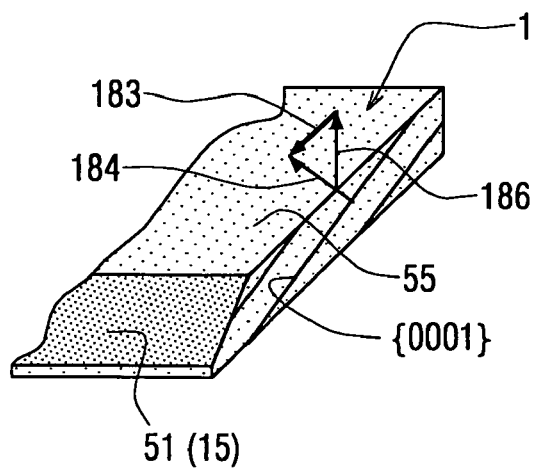
FIG. 20 is a partially perspective view showing the dislocation control seed crystal, according to the second embodiment.

Here, in FIG. 19, the offset direction 183 is obtained by projecting a normal vector 184 of the {0001} surface on the growing surface 18, i.e., the surface of the SiC single crystal 10. Specifically, the offset direction 183 is a direction of a vector obtained by subtracting a normal vector 186 of the growing surface 18 from the normal vector 184 of the {0001} surface, as shown in FIG. 20.

In the above method, the third seed crystal 5 has the growth surface 55, which is exposed outside, and has the same surface orientation as the growth surface 18 of the dislocation control seed crystal 1 shown in FIG. 1. A part of the third seed crystal 5, which occupies equal to or smaller than 50% of the growth surface 55 of the third seed crystal 5, is processed by a surface treatment so that the grinded surface 51, i.e., the screw dislocation generation region 15 is formed. Thus, the dislocation control seed crystal 1 is completed. In this case, the crystal structure of the grinded surface 51 is deteriorated by the surface treatment. Therefore, by controlling the area and the position of the grinded surface 51, the area and the position of the screw dislocation generation region 15 is easily controlled.

The above surface treatment provides to change the crystal structure of the SiC single crystal partially. The surface treatment can be, for example, an ion implantation method and the surface machining such as a grinding method. Thus, the surface treatment is easily performed so that the screw dislocation generation region 15 is formed on the growth surface 55 of the third seed crystal 5.

Figure 21:
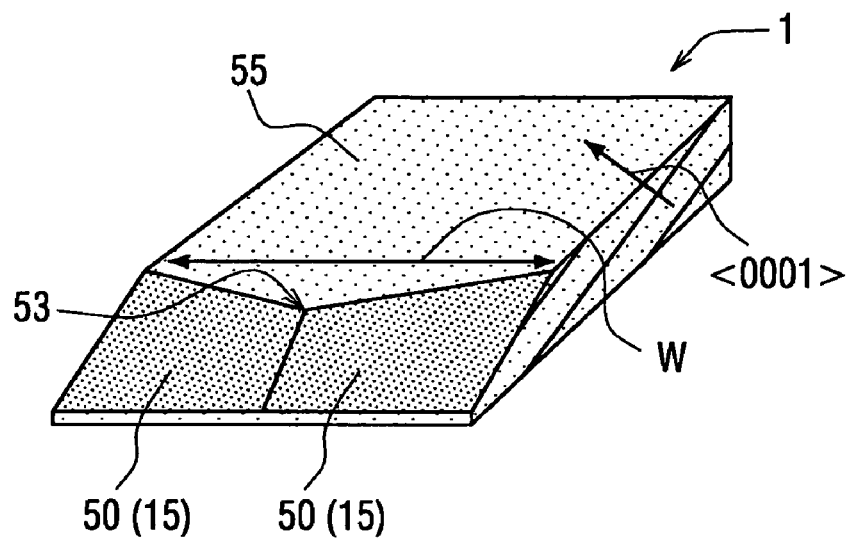
FIG. 21 is a perspective view explaining a method for manufacturing the SiC single crystal by controlling a C-surface facet, according to the second embodiment.

Although the grinded surface 51 is provided by one plane, the grinded surface 51 can be provided by multiple planes. For example, as shown in FIG. 21, the surface treatment is performed such that multiple inclined surfaces 50 having different tilting angles (i.e., different inclination angles) and/or different tilting directions (i.e., different inclination directions) are formed on the growth surface 55 of the third seed crystal 5. The inclined surfaces 50 and the growth surface 55 form a boundary, which includes multiple corners 53. In FIG. 21, the boundary has only one corner 53 disposed at the center in the direction W, which is perpendicular to both of the <0001> direction and the offset direction 183. The corner 53 can be a rounded corner having a curvature radius of R at a top end of the corner 53. In this case, the position of the C-surface facet 105 is controlled to some extent. Specifically, the C-surface facet 105 generates near the corner 53 of the growth surface 55 of the dislocation control seed crystal 1. Therefore, the C-surface facet 105 on the growing surface 103 is aligned at almost the center of the direction W and disposed over the boundary between the inclined surfaces 50 and the growth surface 55. Thus, the area of the C-surface 105 becomes smaller, so that the heterogeneous polymorphous crystal and the different surface orientation crystal are much reduced.

Although the grinded surface 51 is composed of one region, the grinded surface 51, i.e., the screw dislocation generation region 15 can include multiple regions, which are capable of generating the screw dislocation having different screw dislocation densities. Preferably, the region 158 capable of generating the screw dislocation having high density higher than other regions 159 is disposed at a periphery, i.e., at an end of the dislocation control seed crystal 1. Specifically, as shown in FIGS. 22 and 23, the region 158 capable of generating the screw dislocation with high density is disposed outside of the region 159 capable of generating the screw dislocation with low density.

Figure 22:
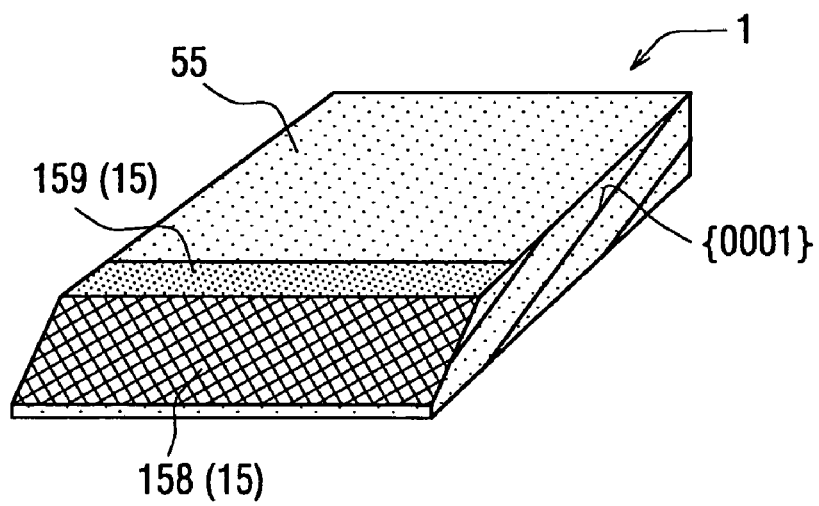
FIG. 22 is a perspective view showing a dislocation control seed crystal having two different screw dislocation generation regions, according to the second embodiment.

In FIG. 22, the screw dislocation generation region 15 includes the first region 158 and the second region 159. The first region 158 is capable of generating the screw dislocation with high density. The second region 159 is capable of generating the screw dislocation with low density. The growth surface 55 of the third seed crystal 5 is grinded so that the screw dislocation generation region 15 is formed. Then, the end of the screw dislocation generation region 15 is further grinded so that the first region 158 is formed. Thus, the screw dislocation generation region 15 includes the first and second regions 158, 159. The first region 158 becomes the inclined surface 50. Here, the second region 159 and the growth surface 55 are almost disposed on the same plane so that the surface of the second region 159 almost coincides to the growth surface 55. However, the second region 159 can have the tilt angle from the growth surface 55.

Figure 23:
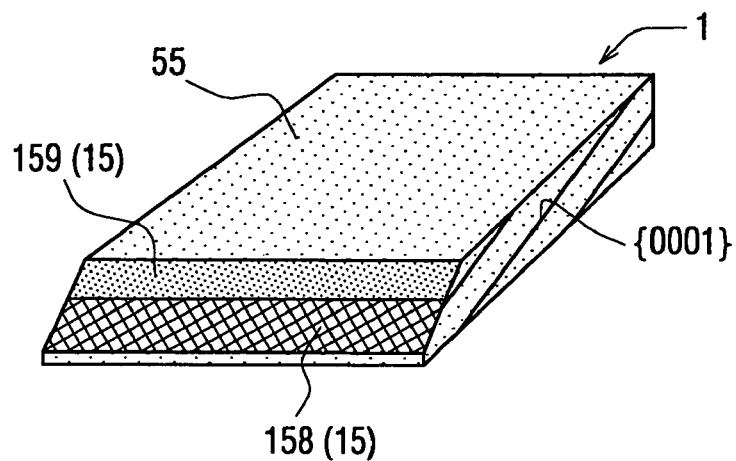
FIG. 23 is a perspective view showing another dislocation control seed crystal having two different screw dislocation generation regions, according to the second embodiment.

In FIG. 23, the growth surface 55 of the third seed crystal 5 is grinded so that the inclined surface 50 is formed. Then, a part of the inclined surface 50 disposed at the end of the third seed crystal 5 is further grinded so that the first region 158 is formed. Here, the first and second regions 158, 159 have almost the same tilt angle so that the surface of the first region 158 almost coincides to the surface of the second region 159. However, the second region 159 can have different tilt angle different from that of the first region 158.

In the above cases shown in FIGS. 22 and 23, the C-surface facet 105 easily moves from the first region side to the second region side. Specifically, the C-surface facet 105 easily moves inside of the seed crystal 1. Therefore, the first region 158 having high density screw dislocation is disposed outside of the second region 159 having low density screw dislocation so that the screw dislocation generated from the screw dislocation generation region 15 is prevented from moving outside of the C-surface facet 105 while the SiC single crystal 10 is growing. Thus, the quality of the SiC single crystal 10 is limited from deteriorating. Another method for limiting the screw dislocation from moving outside of the C-surface facet 105 is such that the area of the screw dislocation generation region 15 becomes larger. However, in this case, the screw dislocation in the growing crystal increases so that the quality of the SiC single crystal may be reduced.

Third Embodiment

A method for manufacturing the SiC single crystal according to a third embodiment of the present invention is such that the C-surface facet 105 formed on the growing surface 103 is controlled to have a predetermined position so that the SiC single crystal having high quality is grown.

Firstly, the dislocation control seed crystal 150 shown in FIG. 3 is prepared. Then, the SiC single crystal is grown in the direction of <1$\bar{1}$00>, and further, the SiC single crystal is grown in the direction of <11$\bar{2}$0>. Then, the dislocation control seed crystal 1 is sliced so that the top surface of the sliced dislocation control seed crystal 1 tilts from the {0001} surface by 8 degrees. The screw dislocation generation region 15 as the high density screw dislocation region is exposed outside, and disposed at the periphery of the dislocation control seed crystal 1.

Figure 12:
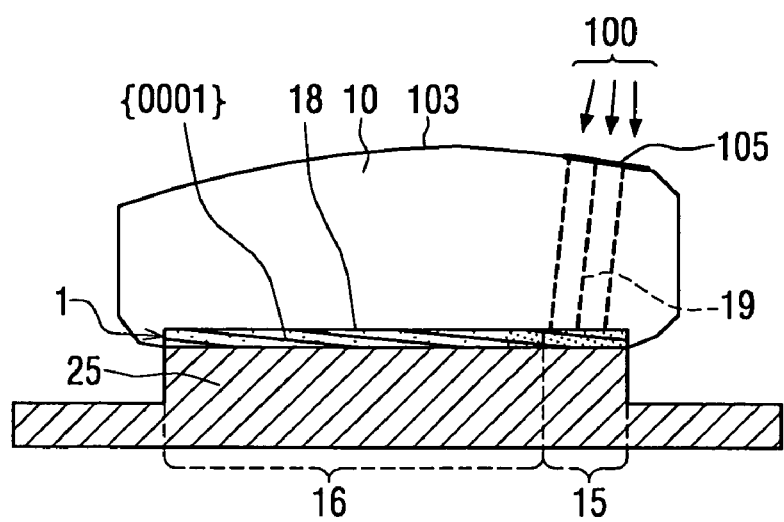
FIG. 12 is a cross sectional view explaining a method for manufacturing a silicon carbide single crystal on a dislocation control seed crystal, according to a third embodiment of the present invention.

Next, the SiC single crystal 10 is grown from the dislocation control seed crystal 1 by the sublimation recrystallization method. As shown in FIG. 12, reactive gas 100 for forming the SiC single crystal 10, i.e., the sublimed SiC raw powder 109 has a certain concentration of a portion over the screw dislocation generation region 15, the concentration which is higher than that of other portion around the screw dislocation generation region 15. In this case, the SiC single crystal 10 grown from the screw dislocation generation region 15 grows faster. Thus, the C-surface facet 105 becomes smaller so that the SiC single crystal 10 has a small amount of a part including the screw dislocation 19 with high density.

Figure 13:
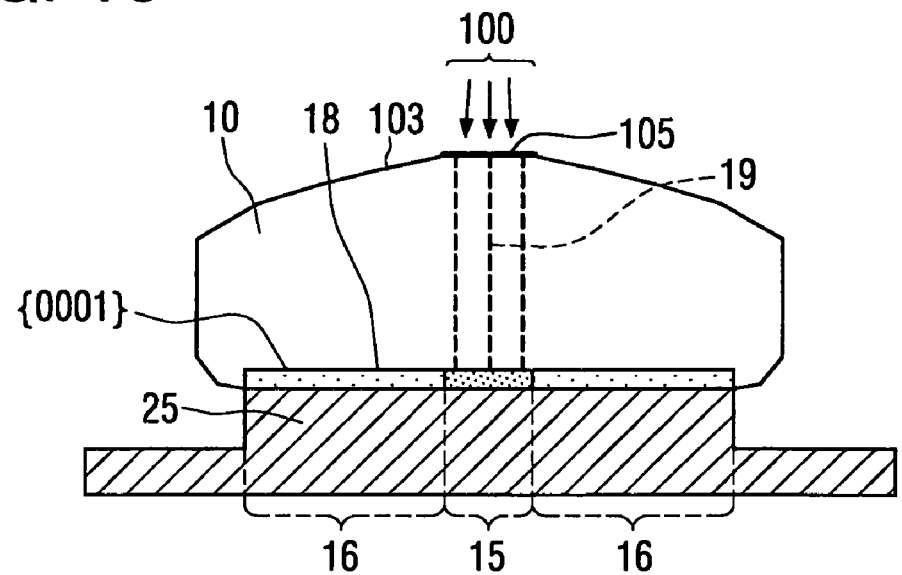
FIG. 13 is a cross sectional view explaining another method for manufacturing a silicon carbide single crystal on a dislocation control seed crystal, according to the third embodiment.

Although the SiC single crystal 10 is grown from the dislocation control seed crystal 1 having the screw dislocation generation region 15 disposed at the periphery of the seed crystal 1, another dislocation control seed crystal 1 having the screw dislocation generation region 15 disposed at the center of the seed crystal 1 can be used, as shown in FIG. 13. In this case, the concentration of the reactive gas 100 of the portion over the screw dislocation generation region 15 is higher than that of the other portion around the screw dislocation generation region 15. Thus, the C-surface facet 105 formed on the growing surface 103 can be controlled to be a predetermined position.

Figure 14:
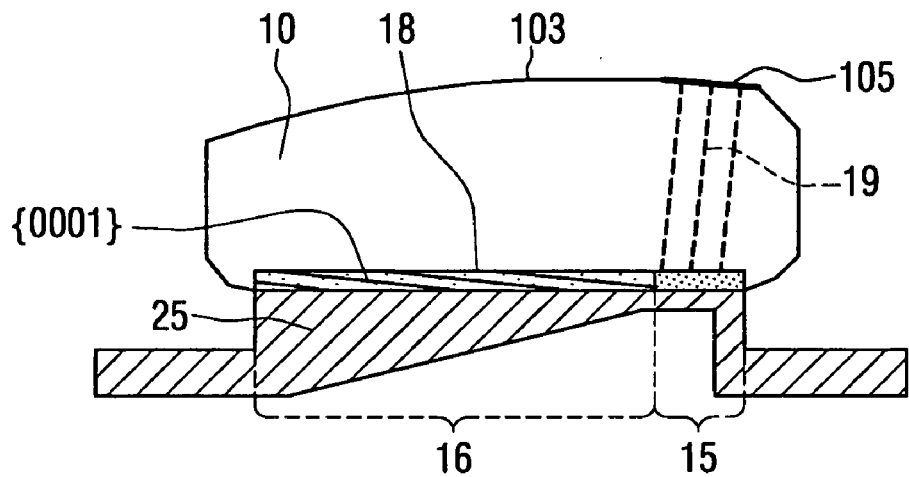
FIG. 14 is a cross sectional view explaining further another method for manufacturing a silicon carbide single crystal on a dislocation control seed crystal, according to the third embodiment.

Furthermore, other methods except for controlling the concentration of the reactive gas can be used. For example, the temperature of the portion over the screw dislocation generation region 15 is set to be lower than that of the other portion around the screw dislocation generation region 15 so that the C-surface facet 105 formed on the growing surface 103 can be controlled to be a predetermined position. Specifically, as shown in FIG. 14, the base 25, on which the dislocation control seed crystal 1 is disposed, is partially thinned. The thickness of a part of the base 25, which corresponds to the screw dislocation generation region 15, is thinner than that of the other portion of the base 25. For example, when the SiC single crystal 10 is grown from the dislocation control seed crystal 1 having the screw dislocation generation region 15 disposed at the periphery of the seed crystal 1, the base 25 having the thickness of the portion, which is disposed under the screw dislocation generation region 15 is partially thinned, is used for forming the SiC single crystal 10 by the sublimation recrystallization method, as shown in FIG. 14. The portion of the base 25, which is thinned, has good heat radiation characteristic, i.e., the portion of the base 25 radiates heat more than the other portion of the base 25 so that the temperature of the screw dislocation generation region 15 is lower than that of the other portion of the dislocation control seed crystal 1 disposed around the screw dislocation generation region 15. Therefore, the SiC single crystal 10 growing from the screw dislocation generation region 15 is growing faster than other part of the SiC single crystal 10 growing from the other region disposed around the screw dislocation generation region 15. Thus, the C-surface facet 105 becomes smaller so that the SiC single crystal 10 has a small amount of a part including the screw dislocation 19 with high density.

Although the base 25 is partially thinned so that the temperature of the screw dislocation generation region 15 is lowered, another method can be used. For example, a heat insulation is partially inserted between the dislocation control seed crystal 1 and the base 25. Specifically, the heat insulation is disposed under the low density screw dislocation region 16 so that the temperature of the low density screw dislocation region 16 becomes higher. Further, the dislocation control seed crystal 1 is mounted at a slant so that the temperature of the screw dislocation generation region 15 is lowered. Furthermore, a heater for heating the crucible 2 is disposed asymmetry. Or a thermal shield plate having asymmetric shape is disposed between the SiC raw powder and the dislocation control seed crystal 1.

Figure 15:
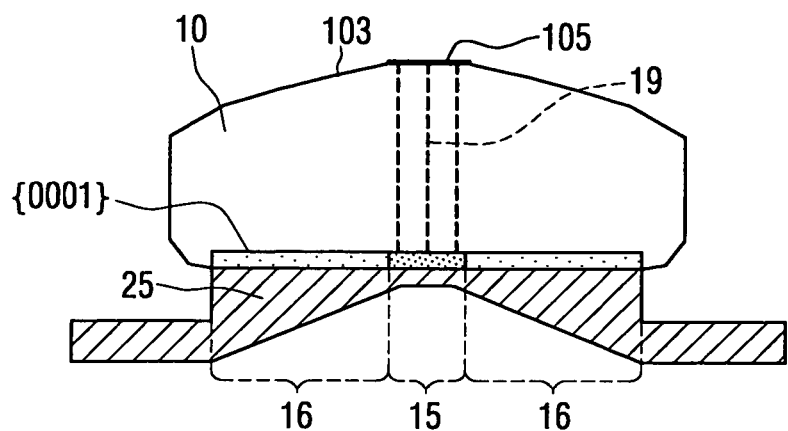
FIG. 15 is a cross sectional view explaining furthermore another method for manufacturing a silicon carbide single crystal on a dislocation control seed crystal, according to the third embodiment.

Furthermore, as shown in FIG. 15, the {0001} surface as the growth surface 18 is exposed outside, and the dislocation control seed crystal 1 having the screw dislocation generation region 15 disposed at the center of the seed crystal 1 can be used. In this case, the base 25 has the thickness of the portion, which is disposed under the screw dislocation generation region 15 and partially thinned. The base 25 is used for forming the SiC single crystal 10 by the sublimation recrystallization method. Therefore, the C-surface facet 105 becomes smaller so that the SiC single crystal 10 has a small amount of a part including the screw dislocation 19 with high density.

Fourth Embodiment

Figure 24:
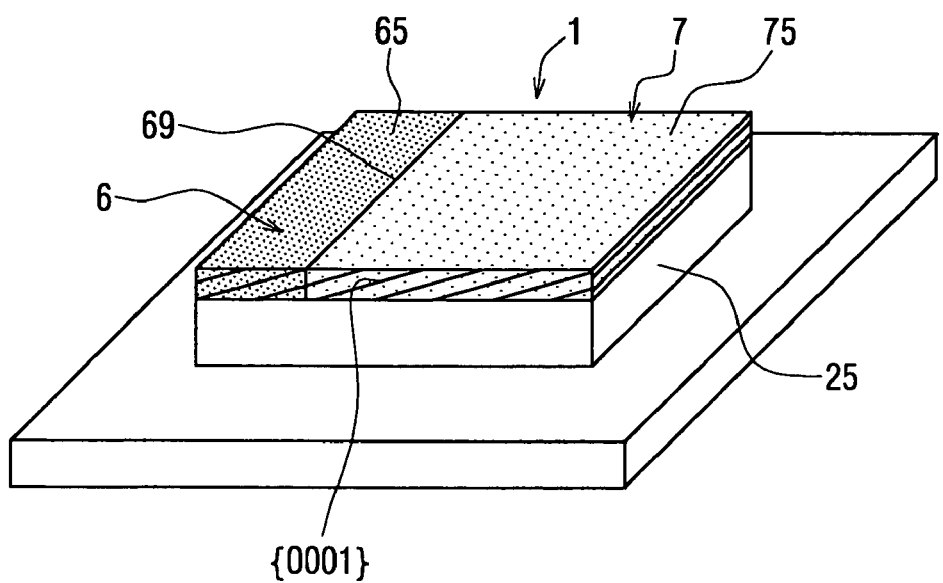
FIG. 24 is a perspective view showing a dislocation control seed crystal having two different screw dislocation generation regions, according to a fourth embodiment of the present invention.

A method for manufacturing the SiC single crystal according to a fourth embodiment of the present invention is such that the dislocation controlled seed crystal 1 having the first seed crystal 6 and the second seed crystal 7 is used for forming the SiC single crystal 10, as shown in FIG. 24. The first seed crystal 6 is capable of generating the screw dislocation 19, and the second seed crystal 7 is capable of generating the screw dislocation 19 having a screw dislocation density lower than that of the first seed crystal 6. The second seed crystal 7 may be incapable of generating the screw dislocation substantially. The growth surface 65 of the first seed crystal 6 and the growth surface 75 of the second seed crystal 7 are disposed on the same plane. Here, the growth surface 65 of the first seed crystal 6 corresponds to the screw dislocation generation region 15 shown in FIG. 1. The growth surface 75 of the second seed crystal 7 corresponds to the low density screw dislocation region 16 shown in FIG. 1.

Figure 8:
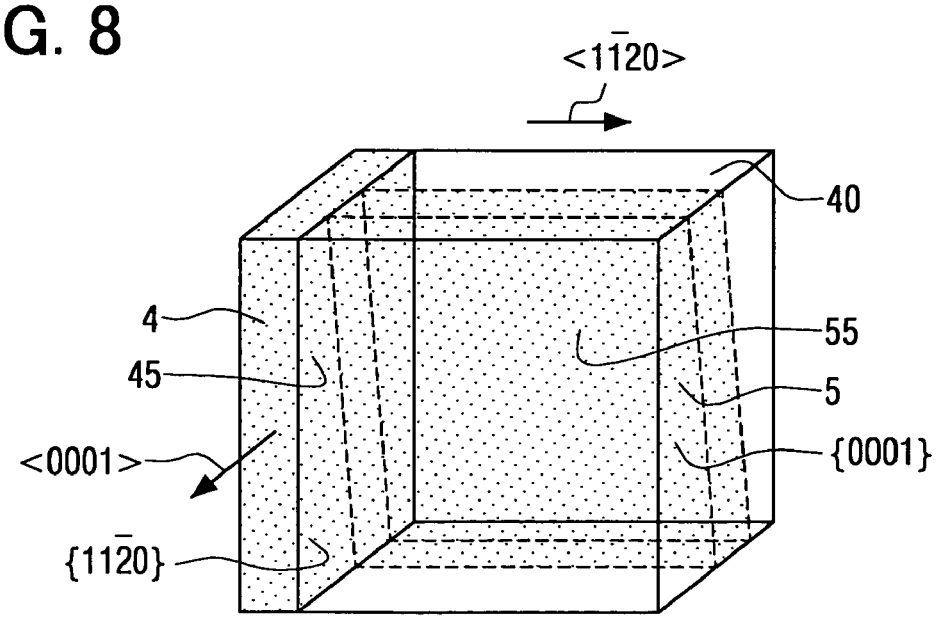
FIG. 8 is a perspective view explaining the second A-surface crystal growth, so that a dislocation control seed crystal is sliced, according to the second embodiment.

Specifically, the second seed crystal 7 has the growth surface 75 tilted from the {0001} surface by 8 degrees, which is formed by the method shown in FIGS. 7 and 8. Thus, the second seed crystal 7 is formed by the A-surface crystal growth method. Therefore, the second seed crystal 7 does not include the screw dislocation 19 substantially.

Next, the first seed crystal 6, which is capable of generating the screw dislocation 19, is prepared as follows. The first seed crystal 6 has the growth surface 65 tilted from the {0001} surface by 8 degrees, which is formed by the C-surface crystal growth method. Therefore, the first seed crystal 6 includes the screw dislocation 19.

Then, the first and second seed crystals 6, 7 are disposed on the base 25 so that the growth surface 65 of the first seed crystal 6 and the growth surface 75 of the second seed crystal 7 are disposed on the same plane. At this time, the crystal orientation of the first seed crystal 6 coincides to the crystal orientation of the second seed crystal 7. Further, the first seed crystal 6 is adjacent to the second seed crystal 7 in a direction of the C-surface facet to be formed in a case where the SiC single crystal is grown from the second seed crystal 7. Although the first and second seed crystals 6, 7 are directly pressed and adhered on the base 25, after the first and second seed crystals 6, 7 are preliminary adhered together, then the first and second seed crystals 6, 7 are mounted on the base 25.

Here, a boundary between the first and second seed crystals 6, 7 is perpendicular to the <11$\bar{2}$0> direction. In this case, the first and second seed crystals 6, 7 are bonded strongly at the boundary so that the step is supplied from the first seed crystal 6 to the second seed crystal 6 more stably.

FIG. 24 shows a case where the SiC single crystal is grown by an offset crystal growth method. The dislocation control seed crystal 1 includes the first and second seed crystals 6, 7. When the SiC single crystal is grown by an onset crystal growth, which has the offset angle of null degree, the first seed crystal 6 having the screw dislocation is preferably disposed at a center of the second seed crystal 7. Specifically, a hole is formed at the center of the second seed crystal 7 so that the first seed crystal 6 is embedded into the hole of the second seed crystal 7.

Next, the SiC single crystal 10 is formed by using the dislocation control seed crystal 1. The SiC single crystal 10 is grown by the sublimation recrystallization method. At this time, the C-surface facet is formed on the first seed crystal 6 so that the screw dislocation 19 is transferred from the screw dislocation 19 in the first seed crystal 6 into the C-surface facet. A boundary 69 between the first and second seed crystals 6, 7 adheres in accordance with the crystal growth. The step generated from the screw dislocation 19 on the C-surface facet 105 of the first seed crystal 6 is supplied to the growing crystal disposed on the second seed crystal 7 across the boundary 69. Thus, the step is supplied to the growing crystal disposed on the second seed crystal 7 stably, so that the growing crystal on the second seed crystal 7 does not include the heterogeneous polymorphous crystal. Thus, the growing crystal on the second seed crystal 7 has high quality. In this case, the first seed crystal 6, which provides the step, is preferably selected so that the screw dislocation density of the screw dislocation generated from the growth surface 65 of the first seed crystal 6, i.e., the screw dislocation generation region 15, is easily controlled.

Thus, the first seed crystal 6 generates the screw dislocation 19, which supplies the step to the SiC single crystal grown from the second seed crystal 7. Here, the second seed crystal 7 does not generate the screw dislocation 19, so that the screw dislocation 19 is only formed in the SiC single crystal 10 grown from the first seed crystal 6. Therefore, the SiC single crystal 10 grown from the second seed crystal 7 does not include the screw dislocation substantially so that the SiC single crystal has high quality.

In the above method, the crystal orientation of the first seed crystal 6 coincides to the crystal orientation of the second seed crystal 7. If the crystal orientation of the first seed crystal 6 is different from the crystal orientation of the second seed crystal 7, the step may not supply from the first seed crystal 6 to the second seed crystal 7 stably.

Another method for manufacturing the SiC single crystal as a comparison of the above methods is provided. A seed crystal formed by the A-surface crystal growth method is prepared, and the SiC single crystal is grown from the seed crystal so that the dislocation control seed crystal is sliced to expose the growth surface of the {0001} surface. Thus, the SiC single crystal is formed by using the dislocation control seed crystal. Specifically, the seed crystal having the {1$\bar{1}$00} surface as the growth surface exposed outside is prepared, so that the SiC single crystal is grown on the growth surface, i.e., the {1$\bar{1}$00} surface shown in FIG. 7. Then, the seed crystal having the {11$\bar{2}$0} surface exposed outside is formed from the SiC single crystal. Further, the SiC single crystal is grown on the growth surface of the {11$\bar{2}$0} surface, so that the dislocation control seed crystal is sliced to expose the growth surface of the {0001} surface. This dislocation control seed crystal includes no screw dislocation or no penetration defect. Next, the dislocation control seed crystal having the {0001} surface as the growth surface is used for manufacturing the SiC single crystal. The SiC single crystal includes multiple C-surface facets are formed on the surface of the growing crystal at irregular positions. Further, since the C-surface facet does not have the screw dislocation so that there is no source for supplying steps of the 4H SiC single crystal. Therefore, the heterogeneous polymorphous crystal is formed on the C-surface facet at the beginning of the crystal growth. Specifically, a two dimensional nucleous is generated on the C-surface facet. Furthermore, the heterogeneous polymorphous crystal is generated in the whole SiC single crystal from the C-surface facet, so that the screw dislocation including the penetration defect is formed along with the heterogeneous polymorphous crystal.

Such changes and modifications are to be understood as being within the scope of the present invention as defined by the appended claims.

What is claimed is:

1. A method for manufacturing a silicon carbide single crystal, the method comprising the steps of:
  preparing a dislocation control seed crystal including a screw dislocation generation region for generating a screw dislocation in the silicon carbide single crystal; and
  growing the silicon carbide single crystal on a growth surface of the dislocation control seed crystal,
  wherein the screw dislocation generation region occupies equal to or smaller than 50% of the growth surface of the dislocation control seed crystal,
  wherein the growth surface has an offset angle equal to or smaller than 60 degrees measured from a {0001} surface of the dislocation control seed crystal,
  wherein the screw dislocation in the silicon carbide single crystal generated from the screw dislocation generation region has a density higher than a density of the screw dislocation in the other region of the silicon carbide single crystal,
  wherein, in the step of growing the silicon carbide single crystal, the silicon carbide single crystal includes a flat C-surface facet disposed on a growing surface of the silicon carbide single crystal, and
  wherein the C-surface facet overlaps at least one of parts of the growing surface provided by projecting the screw dislocation generation region in a direction perpendicular to the growth surface and in a direction parallel to a <0001> axis of the dislocation control seed crystal, respectively.

2. The method according to claim 1,
  wherein the C-surface facet is disposed at a center of the growing surface in a direction perpendicular to both of the <0001> direction of the dislocation control seed crystal and an offset direction of the dislocation control seed crystal.

3. The method according to claim 1,
  wherein the density of the screw dislocation in the silicon carbide single crystal generated from the screw dislocation generation region is one hundred times or more higher than that in the other region of the dislocation control seed crystal.

4. The method according to claim 1,
  wherein the density of the screw dislocation in the silicon carbide single crystal generated from the screw dislocation generation region is equal to or higher than 100 dislocations per square centimeter.

5. The method according to claim 1,
wherein the dislocation control seed crystal further includes a low density screw dislocation region, and
wherein the low density screw dislocation region includes the screw dislocation, which is exposed outside and has a density smaller than 100 dislocations per square centimeter.

6. The method according to claim 5,
wherein the screw dislocation generation region includes the screw dislocation, which is exposed outside and has a density higher than the density of the screw dislocation in the low density screw dislocation region.

7. The method according to claim 6,
wherein the density of the screw dislocation in the screw dislocation generation region is equal to or higher than 100 dislocations per square centimeter.

8. The method according to claim 7,
wherein the screw dislocation generation region includes a high density screw dislocation region having the density of the screw dislocation equal to or higher than 1000 dislocations per square centimeter.

9. The method according to claim 6,
wherein the step of preparing the dislocation control seed crystal includes the steps of:
preparing a first seed crystal including the screw dislocation generation region;
growing the silicon carbide single crystal on the first seed crystal at least once in a direction perpendicular to a C-axis of the first seed crystal so that the silicon carbide single crystal provides the low density screw dislocation region; and
slicing the silicon carbide single crystal including the screw dislocation generation region and the low density screw dislocation region in such a manner that the dislocation control seed crystal includes the screw dislocation generation region having the growth surface exposed outside,
wherein the screw dislocation on the growth surface of the screw dislocation generation region has the density higher than that of the low density screw dislocation region of the dislocation control seed crystal.

10. The method according to claim 5,
wherein, in the step of growing the silicon carbide single crystal, temperature of the screw dislocation generation region is lower than temperature of the low density screw dislocation region.

11. The method according to claim 5,
wherein, in the step of growing the silicon carbide single crystal, reactive gas is introduced on the screw dislocation generation region, and
wherein the reactive gas on the screw dislocation generation region has a concentration, which is higher than that introduced on the low density screw dislocation region.

12. The method according to claim 1,
wherein the step of preparing the dislocation control seed crystal includes the step of:
preparing a first seed crystal including the growth surface with the offset angle equal to or smaller than 60 degrees measured from the {0001} surface of the first seed crystal; and
processing a part of the growth surface of the first seed crystal so that a crystal structure of the first seed crystal is disturbed,
wherein the part of the growth surface occupies equal to or smaller than 50% of the growth surface of the first seed crystal, and
wherein the part of the growth surface provides the screw dislocation generation region.

13. The method according to claim 12,
wherein the step of processing the part of the growth surface is performed by a surface machining method.

14. The method according to claim 13,
wherein the surface machining method is a grinding method.

15. The method according to claim 14,
wherein the grinding method provides a plurality of inclined surfaces having different tilt angles or different tilt directions,
wherein the inclined surfaces are formed on the screw dislocation generation region of the dislocation control seed crystal, and
wherein the inclined surfaces and the growth surface of the low density screw dislocation region form a boundary, which includes a corner disposed at a center in a direction perpendicular to both of the <0001> direction of the first seed crystal and the offset direction.

16. The method according to claim 12,
wherein the step of processing the part of the growth surface is performed by an ion implantation method.

17. The method according to claim 12,
wherein the first seed crystal is formed from a silicon carbide single crystal, which is grown on a preliminary seed crystal at least once in a direction perpendicular to the <0001> axis of the preliminary seed crystal, and
wherein the first seed crystal includes no screw dislocation.

18. The method according to claim 1,
wherein the dislocation control seed crystal includes a first seed crystal and a second seed crystal,
wherein the first seed crystal is capable of generating the screw dislocation in the silicon carbide single crystal with high density higher than that generated from the second seed crystal, and
wherein the growth surfaces of the first and second seed crystals are disposed on a same plane.

19. The method according to claim 1,
wherein the dislocation control seed crystal includes a first seed crystal and a second seed crystal,
wherein the first seed crystal is capable of generating the screw dislocation in the silicon carbide single crystal,
wherein the second seed crystal is incapable of generating the screw dislocation in the silicon carbide single crystal, and
wherein the growth surfaces of the first and second seed crystals are disposed on a same plane.

20. The method according to claim 1,
wherein the growth surface of the dislocation control seed crystal tilts from the {0001} surface of the dislocation control seed crystal by a tilt angle in a range between 1° and 150.

21. The method according to claim 1,
wherein the screw dislocation generation region includes a plurality of regions capable of generating the screw dislocation having different densities, and
wherein one of the regions of the screw dislocation generation region disposed outside of the dislocation control seed crystal is capable of generating the screw dislocation having high density higher than that generated from the other regions of the screw dislocation generation region disposed inside of the dislocation control seed crystal.

22. A method for manufacturing a silicon carbide single crystal, the method comprising the steps of:
preparing a dislocation control seed crystal; and
growing the silicon carbide single crystal on a growth surface of the dislocation control seed crystal,
wherein the dislocation control seed crystal includes a screw dislocation generation region for generating a screw dislocation in the silicon carbide single crystal and a low density screw dislocation region,
wherein the screw dislocation generation region occupies equal to or smaller than 50% of the growth surface of the dislocation control seed crystal,
wherein the growth surface has an offset angle equal to or smaller than 60 degrees measured from a {0001} surface of the dislocation control seed crystal,
wherein the low density screw dislocation region includes the screw dislocation having a surface density smaller than 100 dislocations per square centimeter, and
wherein the screw dislocation generation region includes the screw dislocation having a surface density equal to or higher than 100 dislocations per square centimeter.

23. The method according to claim 22,
wherein, in the step of growing the silicon carbide single crystal, a flat C-surface facet disposed on a growing surface of the silicon carbide single crystal is formed, and
wherein the C-surface facet is controlled to overlap at least one of parts of the growing surface provided by projecting the screw dislocation generation region in a direction perpendicular to the growth surface and in a direction parallel to a <0001> axis of the dislocation control seed crystal, respectively.

24. The method according to claim 22,
wherein the step of preparing the dislocation control seed crystal includes the steps of:
preparing a first seed crystal including the screw dislocation generation region;
growing the silicon carbide single crystal on the first seed crystal at least once in a direction perpendicular to a C-axis of the first seed crystal so that the silicon carbide single crystal provides the low density screw dislocation region; and
slicing the silicon carbide single crystal including the screw dislocation generation region and the low density dislocation region in such a manner that the dislocation control seed crystal includes the screw dislocation generation region having the growth surface exposed outside,
wherein the screw dislocation on the growth surface of the screw dislocation generation region has the density higher than that on the low density screw dislocation region.

25. The method according to claim 22,
wherein the step of preparing the dislocation control seed crystal includes the step of:
preparing a first seed crystal including the growth surface with the offset angle equal to or smaller than 60 degrees measured from the {0001} surface of the first seed crystal; and
processing a part of the growth surface of the first seed crystal so that a crystal structure of the first seed crystal is disturbed,
wherein the part of the growth surface occupies equal to or smaller than 50% of the growth surface of the first seed crystal, and
wherein the part of the growth surface provides the screw dislocation generation region.

26. The method according to claim 25,
wherein, in the step of processing the part of the growth surface, the part includes a plurality of inclined surfaces having different tilt angles or different tilt directions so that the inclined surfaces provide the screw dislocation generation region of the dislocation control seed crystal.

27. The method according to claim 22,
wherein the step of preparing the dislocation control seed crystal includes the step of:
bonding a first seed crystal and a second seed crystal,
wherein the first seed crystal includes the screw dislocation generation region, and
wherein the second seed crystal includes the low density screw dislocation region.

* * * * *